Jan. 20, 1953 WEN YUAN PAN 2,626,321

PHASE INVERTER CIRCUITS

Filed May 29, 1948 2 SHEETS—SHEET 1

INVENTOR
WEN YUAN PAN
BY Philip G. Cooper
ATTORNEY

WITNESS: F. J. Harbaugh

Jan. 20, 1953 WEN YUAN PAN 2,626,321

PHASE INVERTER CIRCUITS

Filed May 29, 1948 2 SHEETS—SHEET 2

WITNESS:-
F. J. Harbaugh

INVENTOR
WEN YUAN PAN
BY Philip G. Cooper
ATTORNEY

Patented Jan. 20, 1953

2,626,321

UNITED STATES PATENT OFFICE 2,626,321

PHASE INVERTER CIRCUITS

Wen Yuan Pan, Merchantville, N. J., assignor to Radio Corporation of America, a corporation of Delaware Application May 29, 1948, Serial No. 30,017

4 Claims. (Cl. 179—171)

My invention relates to phase inverter circuits for push-pull amplifiers or balanced loads, particularly to such circuits for radio receivers that are energized by a rectified alternating current source of power.

It is an object of my invention to eliminate hum or ripple voltage disturbance introduced by the power supplied to the anode circuits, respectively, of a transformerless push-pull driven stage, such as a combined amplifier-phase inverter.

A further object of my invention is to provide a simplified and inexpensive circuit for balancing out or neutralizing hum or ripple voltage in a transformerless amplifier-phase inverter circuit without sacrificing amplification or fidelity.

A further object of my invention is so to modify an amplifier-phase inverter circuit as to reduce hum or fluctuating voltage disturbance without the addition of circuit elements.

In accordance with my invention, certain elements of a conventional circuit coupling a first audio and phase inverter stage and a balanced load circuit, such as a push-pull audio frequency output amplifier stage, are changed in relative values in such manner as to balance out the hum voltage normally present in the output of the first audio and phase inverter stage.

Whereas, in push-pull amplifier circuits, hum in the anode power supply circuit has balanced out in the two halves of the push-pull circuit and has been no problem, there has been a serious problem in reducing hum in the preceding stage, ordinarily a stage consisting of a first audio and a phase inverter amplifier. Any hum in this stage is fed into the push-pull input and is amplified by the push-pull stage. It has been common practice to provide extra filtering to reduce hum in the D. C. supplied to the anode circuits of said preceding stage. While the hum voltage is fed to the anodes of the first audio and phase inverter stages symmetrically, there is another hum voltage superimposed upon the anode of the phase inverter tube only, that is, the hum voltage fed to the grid of the inverter tube along with the signal, and this voltage is changed in phase. Ordinarily these components on the anode of the phase inverter cancel each other, leaving the hum voltage on the anode of the first audio tube unopposed, and unbalanced, to be impressed upon the input circuit of the output stage.

The features of my invention which I believe to be novel are set forth with particularity in the appended claims. My invention, however, both as to its organization and method of operation, together with further objects and advantages thereof, may best be understood by reference to the following description taken in connection with the accompanying drawing, in which:

Figure 1:
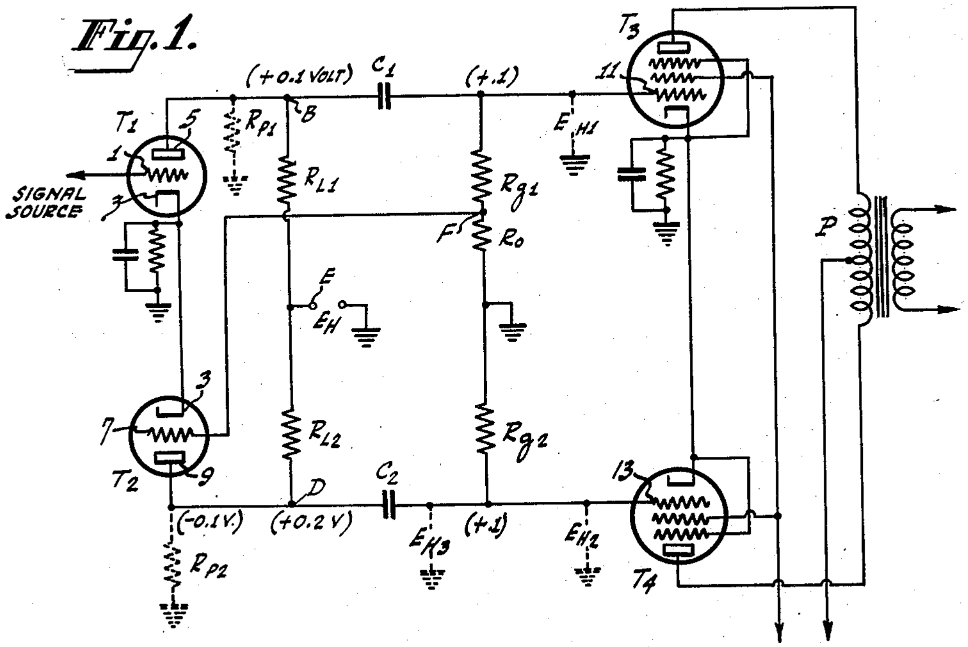
Fig. 1 is a schematic diagram of a phase inverter and push-pull audio frequency amplifier circuit with symbols corresponding to those in my formulae used to explain the invention.
Figure 2:
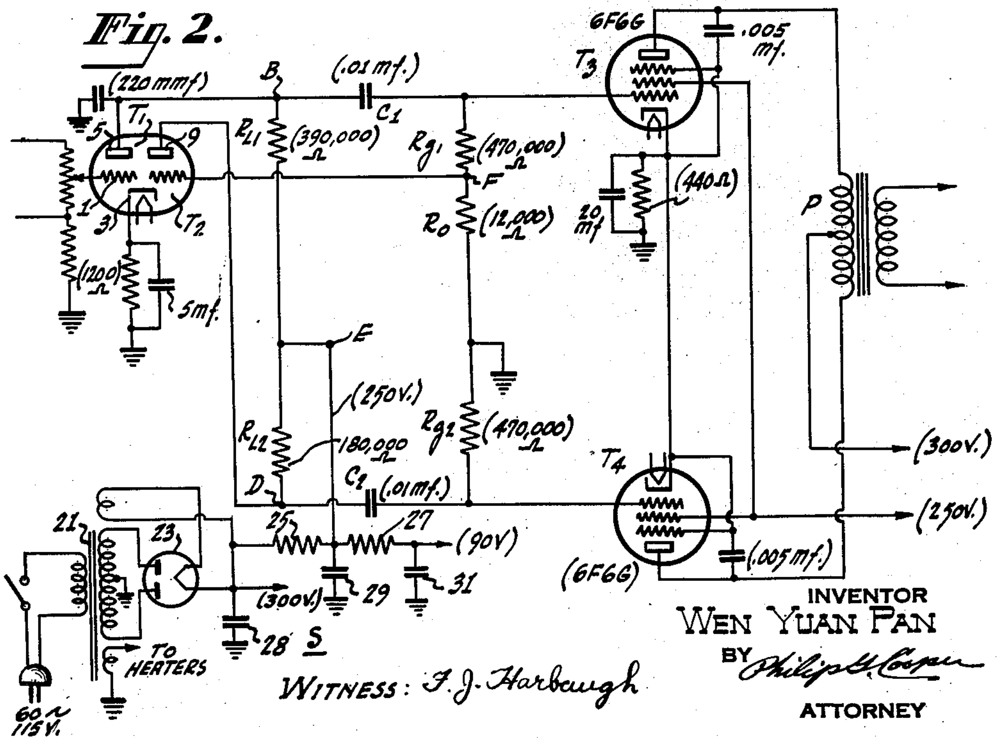
Fig. 2 is a schematic diagram of a practical application of the same circuit, and power supply, giving actual values used in apparatus made in accordance with the invention.

Referring to Fig. 1, an audio frequency amplifier, as of a radio receiver, phonograph amplifier or both, is arranged to be energized from a rectified alternating current source of power, shown more completely in Fig. 2. The amplifier comprises a first audio relay, preferably a thermionic amplifier device $T_1$, having an input electrode or grid 1, a cathode 3, and an anode 5. The input electrode 1 is connected to a source of signals, not shown, which may be a detector circuit of a radio receiver or a phonograph pickup circuit. The anode circuit impedance of device $T_1$ is represented by $R_{p1}$. Another thermionic amplifying device $T_2$, whose internal anode impedance is represented by $R_{p2}$, is shown for inverting the phase of the audio frequency signals 180 degrees in accordance with the teachings of Gorton 1,654,075, dated December 27, 1927. While shown as separate devices, $T_1$ and $T_2$ may be combined in one envelope, as shown in Fig. 2, in the apparatus made according to my invention. An input electrode 7 of device $T_2$ is connected to a potential divider $R_{g1}$ and $R_o$ in the A. C. output circuit of device $T_1$. The output electrodes, or anodes, 5 and 9 of amplifying devices $T_1$ and $T_2$ are D. C. connected through coupling impedance elements or resistors $R_{L1}$ and $R_{L2}$, respectively, to a high voltage terminal E of a rectified and filtered power source (Fig. 2). $E_H$ represents the hum or variation voltage component in the power source output circuit. The same output electrodes are A. C. coupled in signal transfer relation through capacitors $C_1$ and $C_2$, respectively, to resistors $R_{g1}$ and $R_{g2}$, respectively, and to the input electrodes 11 and 13 of amplifying devices $T_3$ and $T_4$, respectively, operating in push-pull relation.

The hum voltage $E_H$ from the rectified power supply source is of the order of a fraction of a volt in most radio receivers using conventional rectifier and filter circuits, and is fed to the grid of amplifier device $T_3$ through resistor $R_{L1}$. When a large coupling capacitor $C_1$ is used, the hum voltage appears across the input circuit of amplifier device $T_3$ as voltage $E_{H1}$, wherein:

$$E_{H1}=E_H\frac{\frac{R_{p1}R_{g1}}{R_{p1}+R_{g1}}}{\frac{R_{p1}R_{g1}}{Rp_1+R_{g1}}+R_{L1}} \quad (1)$$

Let $$R_1=\frac{R_{p1}R_{g1}}{R_{p1}+R_{g1}}$$

and $$R_2=\frac{R_{p2}R_{g2}}{R_{p2}+R_{g2}}$$

We have $$E_{H1}=E_H\frac{R_1}{R_1+R_{L1}} \quad (1a)$$

Similarly, $$E_{H2}=E_H\frac{R_2}{R_2+R_{L2}} \quad (2)$$

where $E_{H2}$ is the hum voltage which appears across the grid circuit of tube $T_4$. $E_{H2}$ may or may not be equal to $E_{H1}$ in magnitude, but $E_{H2}$ is in phase with $E_{H1}$ if large coupling capacitors $C_1$ and $C_2$ are used.

However, a portion of the hum voltage $E_{H1}$ is fed to the grid of tube $T_2$ which is amplified and appears across the grid of tube $T_4$ as $E_{H3}$. For proper operation of the phase inverter, $T_2$, the stage gain is exactly equal to $$\text{Gain (Ph. Inv.)}=\frac{R_{g1}+R_0}{R_0}$$

Consequently, $$E_{H3}=E_{H1}\underline{/180°}=E_{H1}\ (\cos 180°+j\sin 180°=-E_{H1}$$

The resultant hum voltage appears across the grid circuit of tube $T_4$ as $E_{H2}+E_{H3}$ or $E_{H2}-E_{H1}$.

The purpose of this invention is to make $E_{H2}+E_{H3}=E_{H1}$ both in magnitude and in phase at the hum frequencies. This is done by properly selecting the values of $R_{L1}$ and $R_{L2}$ so that $$\frac{R_1}{R_1+R_{L1}}=\frac{1}{2}\frac{R_2}{R_2+R_{L2}} \quad (3)$$

Under these conditions, $$E_{H2}=2E_{H1}$$
$$E_{H3}=-E_{H1}$$

So that $$E_{H2}+E_{H3}=E_{H2}-E_{H1}=E_{H1}$$

When the values of the resistors $R_{L1}$ and $R_{L2}$ are made in accordance with the above derivations, the hum voltage appearing across each input of the amplifiers of the push-pull stage will be equal in magnitude and in phase, hence will be balanced out in the anode output circuits of the push-pull stage in the divided primary P of the output transformer. An improvement of better than 10 times in hum level, compared with results of conventional circuits, was obtained in in actual circuit made in accordance with my invention and shown in Fig. 2.

Referring to Fig. 2, amplifiers $T_1$ and $T_2$ are combined in one envelope, a type known as the RCA–6SC7 tube, having two triodes with a common cathode 3 as the first audio and phase inverter stage, and having a single ended, or one sided input and a double ended, or divided balanced output, as for push-pull operation. In accordance with my invention, as illustrated in above derivation formulae, the ratio of $R_{L1}$ to $R_{L2}$ is such that the hum voltages impressed upon the input electrodes of the push-pull output stage are equal and of like sign, thereby cancelling out. Whereas in conventional circuits the resistors corresponding to $R_{L1}$ and $R_{L2}$ are of the same order of magnitude, in accordance with my invention they are quite different in value, in accordance with Equation 3 above, e. g., 390,000 and 180,000 ohms, respectively. The proportion of the values of these resistors is such that the hum voltage impressed through the phase inverter $T_2$ upon the input of the push-pull stage is twice that from the anode circuit of the first audio amplifier $T_1$. The phase inverter $T_2$ is fed from the output of $T_1$ through potentiometer $R_{g1}$ and $R_0$. The ratio of $R_{g1}+R_0$ to $R_0$ is made equal to the amplification factor of the phase inverter $T_2$. The amplified hum voltage at the anode of $T_2$, derived from $R_{g1}$ and $R_0$, is half that at the anode output arriving through the anode resistor $R_{L2}$ from the power supply and opposite in sign or phase. The difference gives the same hum voltage impressed upon the grid of amplifier $T_4$ from amplifier $T_2$ as is impressed upon amplifier $T_3$ from amplifier $T_1$. A conventional power supply circuit S comprises a transformer 21, rectifier 23, filter resistors 25 and 27, and capacitors 28, 29 and 31.

By way of example, referring to Fig. 1, if a given hum voltage exists on the 250-volt terminal E of the power supply and, after the drop through the resistor $R_{L1}$, there is 0.1 volt applied to the anode 5 of amplifier $T_1$ at point B, then there will be 0.2 volt at point D as a result of the smaller drop through resistor $R_{L2}$. A selected small proportion of the hum voltage in the output circuit of the first audio amplifier $T_1$ is picked off the potentiometer at point F between resistors $R_{g1}$ and $R_0$ and applied along with the signal voltage to the input of the phase inverter $T_2$ so that $-0.1$ volt appears on the anode 9. At point D there will then exist the difference voltage, or $+0.2-0.1=0.1$ volt. There will, therefore, be applied to each input circuit of the push-pull amplifiers $T_3$ and $T_4$ a hum voltage of $+0.1$ volt, which cancels out in the anode circuits of $T_3$ and $T_4$.

The non-symmetrical arrangement of resistors in the hum neutralization system, described above, does not disturb the symmetry of signal voltages. The ratio of resistors $R_{g1}$ to $R_0$ is such that the right amount of signal voltage is impressed on the phase inverter $T_2$ and the same signal voltages are obtained in the output circuits of $T_1$ and $T_2$ and in the input circuits of the push-pull stage. It will be apparent, therefore, that without deleteriously affecting the normal signal functions of the first audio and phase inverter circuits feeding the push-pull stage, I have provided, at practically no additional cost and with no new parts and complications, a novel circuit for canceling hum voltage in the anode supply circuit to the first audio and phase inverter stage, thereby reducing to a minimum the overall hum disturbance.

Figure 3:
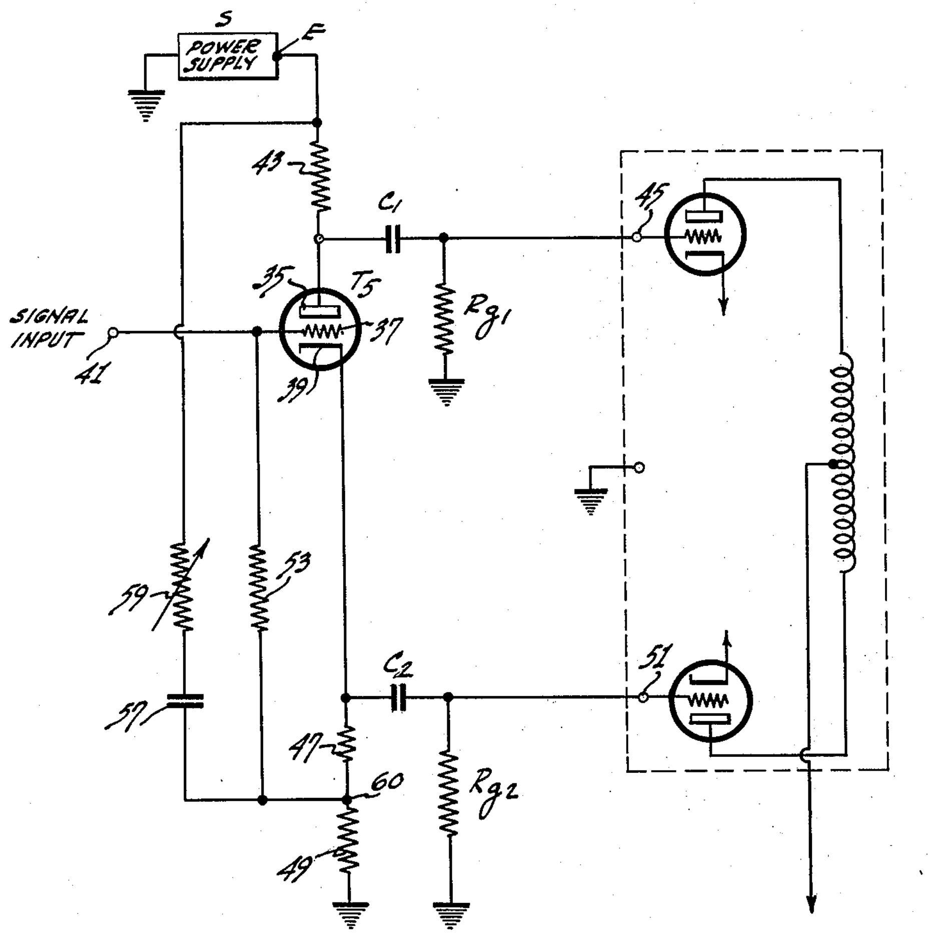
Fig. 3 is a schematic diagram of another type of phase inverter embodying my invention.

Referring to Fig. 3, I have shown my invention with another type of phase inverter, the divided or split anode-cathode output type as disclosed in U. S. Patents 2,052,730 to Stoutenburgh and 2,027,054 to Miessner. A thermionic device $T_5$, preferably a triode with anode 35, control electrode 37 and indirectly heated cathode 39, is connected to an audio signal source at terminal 41, which may be the output of the first audio amplifier in a radio receiver. The anode 35 is supplied with voltage from terminal E of a power source, similar to that in Fig. 2, through a resistor 43 of the order of 27,000 ohms. The anode is coupled in the usual manner to one terminal 45 of a push-pull amplifier stage or other balanced output circuit, as shown in Figs. 1 and 2. The cathode 39 is connected to ground through resistors 47 and 49, and is coupled to the other input terminal 51 of the push-pull amplifier or balanced load. Resistor 49 is large compared to resistor 47. Resistor 49 is of the same order of magnitude as resistor 43. The control electrode 37 receives its bias voltage through resistor 47 by way of a resistor 53 connected to a point 60 between cathode resistors 47 and 49. Resistors 47 and 49 function as a tapped single resistor common to input and output circuits and provide degenerative feedback. This type phase inverter has a gain of only unity, but can still be termed an implifier as in the case of Figs. 1 and 2. The anode output may be termed the amplifier side and the cathode output the inverter side of the divided output of the stage.

The anode circuit is subject to hum from terminal E of the power supply source S, as in Fig. 1, the hum being impressed upon anode and cathode by way of resistors 43, 47 and 49. A portion of the hum voltage is impressed upon the control electrode 37 by way of the grid leak resistor 53. Practically the same hum voltage, however, appears on the control electrode and cathode and thereby is nullified, so far as the relaying action of the tube is concerned, and does not introduce hum of opposite phase into the anode circuit to oppose that impressed upon the anode through resistor 43. Furthermore, the cathode to ground circuit impedance, by reason of the degenerative cathode follower action, is low as compared with the anode resistance of the tube. Hence the hum voltage impressed by the cathode 39 upon the input electrode, terminal 51, of on side of the following push-pull stage is small compared with that impressed by the anode 35 upon the other side, terminal 45, of the push-pull stage.

According to my invention, the hum voltage in the output from the cathode 39 is increased sufficiently to balance that from anode 35 by means of a branch circuit, comprising resistor 59 and blocking capacitor 57 connected from the point E, in the power supply output which supplies the anode 35, to point 60 in the circuit of cathode 39. The branch circuit may be connected directly to the cathode 39, if desired, although the point 60 is nearly as high as the cathode potential by reason of the large ratio of resistance of resistor 49 to resistor 47. The latter is sometimes bypassed, leaving only the coupling resistance of 49. The sizes of the different components will be determined by various factors such as the type of tube $T_5$, whether the input thereto is of high or low impedance, etc., as will be obvious to those skilled in the art. The size of capacitor 57 will be related to that of $C_1$ in the matter of avoiding undesired phase shift. While resistor 59 has been shown as adjustable for the purpose of obtaining hum balance in the two sides of the output circuit, it will ordinarily be fixed in production.

While a few extra elements apparently have been added in this modification to obtain hum reduction, the expense has been increased little, if any, for the following reason: To obtain comparable results in the usual manner, extra filtering has been found necessary to reduce hum voltage from terminal E. It seems apparent, therefore, that the results in the case of Fig. 3 are within the objects of the invention, as in the case of Fig. 2.

I claim as my invention:

1. In an amplifier phase inverter system having a single sided signal input and a divided output circuit, first and second thermionic devices each having a control electrode, an anode and a cathode, a power source having a point of high positive potential for supplying direct current with a fluctuating voltage component to said anodes, said first device having its input electrode connected to said single sided input circuit and its output electrode to one side of said divided output circuit, a shunt potential divider in said one side having a relatively low potential point between a high resistance section $R_{g1}$ and a low resistance section $R_0$, said portions having a ratio such that the sum of $R_{g1}$ and $R_0$ to $R_0$ substantially equals the amplification factor of said second device, said second device having its input electrode connected to said point in said potential divider in said one side of said divided output circuit for picking up amplified signal voltage and a portion of the fluctuating component, which component appears at the anode of said second device in opposite phase and at a voltage substantially equal to that on the anode of said first device, first and second impedance elements connecting the anodes of said first and second devices, respectively, to said power source point, said second element being smaller in impedance than said first element in a ratio to impress substantially twice the fluctuating component on the anode of said second device to produce resultant fluctuating components of substantially like magnitude and phase on both sides of said divided output circuit.

2. The invention as set forth in claim 1, wherein said impedance elements are resistors the first of which has substantially twice the value of resistance as the second.

3. In a push-pull amplifying system, an amplifier-inverter stage comprising first and second amplifying devices having a single sided signal input and a two sided divided output circuit arranged to be energized by a rectified alternating current power source for supplying direct current with an undesired hum voltage component, said first amplifying device having a control electrode connected in said input circuit and an output electrode connected to the first side of said output circuit, a first load resistor connecting said output electrode to a terminal of said power source to receive therefrom said direct current with said component, a potential divider connected in said output circuit in shunt with said first side, said divider having a relatively low potential point between a high resistance section $R_{g1}$ and a low resistance section $R_0$ having a ratio therebetween such that the sum of $R_{g1}$ and $R_0$ to $R_0$ substantially equals the amplification factor of said second device, said second amplifying device having an output electrode connected to the second side of said output circuit and a control electrode connected to said point on said divider for receiving a portion of amplified signal energy along with said undesired hum component, said component being amplified by said second device and appearing on its output electrode as substantially the same voltage but in reversed phase relative to the component on said output electrode of said first device, and means comprising a second load resistor of the order of half the resistance of said first load resistor connecting said output electrode of said second device to said terminal for supplying substantially twice the hum voltage component to said last named output electrode than is supplied to said output electrode of said first device through said first resistor and of the same phase, whereby the net hum component impressed upon said second side of said balanced output is substantially equal and of like phase to that impressed upon said first side of said balanced output circuit.

4. The invention as set forth in claim 3, wherein a second stage, comprising third and fourth amplifying devices having a push-pull transformer output, is coupled to said divided output in push-pull relation whereby said hum components, by reason of the similarity in amplitude and phase on the two sides of said output circuit cancel out in said transformer.

WEN YUAN PAN.

REFERENCES CITED

The following references are of record in the file of this patent:

UNITED STATES PATENTS

| Number | Name | Date |
|---|---|---|
| 1,654,075 | Gorton | Dec. 27, 1927 |
| 2,027,054 | Miessner | Jan. 7, 1936 |
| 2,052,730 | Stoutenburgh | Sept. 1, 1936 |
| 2,164,402 | Guanella | July 4, 1939 |
| 2,240,635 | Avins | May 6, 1941 |
| 2,340,617 | Sanford | Feb. 1, 1944 |
| 2,350,858 | Worcester, Jr. | June 6, 1944 |
| 2,383,351 | Smith | Aug. 21, 1945 |
| 2,383,846 | Crawley | Aug. 28, 1945 |